US012625100B2

(12) United States Patent　　(10) Patent No.: US 12,625,100 B2
Selby et al.　　(45) Date of Patent: May 12, 2026

(54) MAGNETIC RESONANCE METHOD AND SYSTEM FOR CHARACTERIZING CIRCULAR COUETTE FLOW OF FLUIDS

(71) Applicants: William Selby, Fredericton (CA); Igor Mastikhin, Fredericton (CA)

(72) Inventors: William Selby, Fredericton (CA); Igor Mastikhin, Fredericton (CA)

(73) Assignee: THE UNIVERSITY OF NEW BRUNSWICK, Fredericton (CA)

( * ) Notice: Subject to any disclaimer, the term of this patent is extended or adjusted under 35 U.S.C. 154(b) by 221 days.

(21) Appl. No.: 18/235,600

(22) Filed: Aug. 18, 2023

(65) Prior Publication Data

US 2024/0068968 A1　　Feb. 29, 2024

Related U.S. Application Data

(60) Provisional application No. 63/399,952, filed on Aug. 22, 2022.

(51) Int. Cl.
*G01N 24/08* (2006.01)
*G01R 33/561* (2006.01)

(52) U.S. Cl.
CPC ....... *G01N 24/081* (2013.01); *G01R 33/5615* (2013.01)

(58) Field of Classification Search
CPC .......................... G01R 33/5615; G01N 24/081
See application file for complete search history.

(56) References Cited

U.S. PATENT DOCUMENTS

| | | | | |
|---|---|---|---|---|
| 6,959,588 B2 * | 11/2005 | Zougari | ............... | G01N 33/343 |
| | | | | 73/61.62 |
| 2001/0037063 A1 * | 11/2001 | Albert | .................. | G01R 33/445 |
| | | | | 600/420 |
| 2016/0018555 A1 * | 1/2016 | Jachmann | ................ | G01V 3/32 |
| | | | | 324/303 |
| 2016/0209312 A1 * | 7/2016 | Brox | ...................... | G01N 24/08 |

OTHER PUBLICATIONS

Colbourne et al., Validation of a low field Rheo-NMR instrument and application to shear-induced migration of suspended non-colloidal particles in Couette flow, Journal of Magnetic Resonance, vol. 286, 2018, pp. 30-35, ISSN 1090-7807, https://doi.org/10.1016/j.jmr.2017.11.010. (Year: 2018).*

(Continued)

*Primary Examiner* — Gregory H Curran
(74) *Attorney, Agent, or Firm* — Eugene Derenyi; Fogler, Rubinoff LLP

(57) ABSTRACT

A method and system of characterizing flow behavior of a fluid sample including providing a magnet with a constant gradient where at least a portion of the sample defining a sensitive region is in the constant gradient, inducing circular Couette flow in the fluid in at least the sensitive region, generating an NMR pulse sequence comprising at least two pulses with a delay between the pulses, acquiring at least one echo from the pulse sequence from the sensitive region, measuring the magnitude of the NMR signal of the at least one acquired echo, normalizing the measured magnitude to a reference magnitude, and using the normalized magnitude to derive a shear rate for the fluid sample.

20 Claims, 8 Drawing Sheets

(56) References Cited

OTHER PUBLICATIONS

P. C. Lauterbur, Image formation by induced local interactions: Examples employing nuclear magnetic resonance, Nature 242 (5394) (1973) 190-191. doi:10.1038/242190a0.

J. E. Tanner, Use of the stimulated echo in NMR diffusion studies, The Journal of Chemical Physics 52 (5) (1970) 2523-2526. doi:10.1063/1.1673336.

T. Grover, J. R. Singer, NMR spin-echo flow measurements, Journal of Applied Physics 42 (3) (1971) 938-940. doi:10.1063/1.1660189.

R. Hayward, K. Packer, D. Tomlinson, Pulsed field-gradient spin echo n.m.r. studies of flow in fluids, Molecular Physics 23 (6) (1972) 1083-1102. doi:10.1080/00268977200101061.

P. Coussot, Progress in rheology and hydrodynamics allowed by NMR or MRI techniques, Experiments in Fluids 61 (9) (Sep. 2020). doi:10.1007/s00348-020-03037-y.

P. T. Callaghan, Rheo-NMR: A new window on the rheology of complex fluids. eMagRes, 2012, vol. 1: 155-168. doi:10.1002/9780470034590.emrstm0470.

P. T. Callaghan, Rheo NMR and shear banding, Rheologica Acta 47 (3) (2008) 243-255. doi:10.1007/s00397-007-0251-2.

R. N. Al-Kaby, S. L. Codd, J. D. Seymour, J. R. Brown, Characterization of velocity fluctuations and the transition from transient to steady state shear banding with and without pre-shear in a wormlike micelle solution under shear startup by rheo-nmr, Applied Rheology 30 (1) (2020) 1-13. doi:10.1515/arh-2020-0001.

J. D. Seymour, B. Manz, P. T. Callaghan, Pulsed gradient spin echo nuclear magnetic resonance measurements of hydrodynamic instabilities with coherent structure: Taylor vortices, Physics of Fluids 11 (5) (1999) 1104-1113. doi:10.1063/1.869981.

P. Galvosas, T. I. Brox, S. Kuczera, Rheo-NMR in food science—recent opportunities, Magnetic Resonance in Chemistry 57 (9) (2019) 757-765. doi:10.1002/mrc.4861.

K .- F. Ratzsch. C. Friedrich, M. Wilhelm, Low-field rheo-NMR: A novel combination of NMR relaxometry with high end shear rheology, Journal of Rheology 61 (5) (2017) 905-917. doi:10.1122/1.4991513.

S.-I. Han, O. Marseille, C. Gehlen, B. Blumich, Rheology of blood by NMR, Journal of Magnetic Resonance 152 (1) (2001) 87-94. doi:10.1006/jmre.2001.2387.

G. Kaysan, N. Schork, S. Herberger, G. Guthhausen, M. Kind, Contact mediated nucleation in melt emulsions investigated by theo-nuclear magnetic resonance, Magnetic Resonance in Chemistry 60 (7) (2021) 615-627. doi:10.1002/mrc.5228.

K. G. Hollingsworth, M. L. Johns, Rheo-nuclear magnetic resonance of emulsion systems, Journal of Rheology 48 (4) (2004) 787-803. doi:10.1122/1.1753277.

V. Rantzsch, M. Wilhelm, G. Guthausen, Hyphenated low-field NMR techniques: combining NMR with NIR, GPC/SEC and rheometry, Magnetic Resonance in Chemistry 54 (6) (2015) 494-501. doi:10.1002/mrc.4219.

A. Colbourne, T. Blythe, R. Barua, S. Lovett. J. Mitchell, A. Sederman, L. Gladden, Validation of a low field rheo-NMR instrument and application to shear-induced migration of suspended non-colloidal particles in couette flow, Journal of Magnetic Resonance 286 (2018) 30-35. doi:10.1016/j.jmr.2017.11.010.

B. Blumich, P. Blumler, G. Eidmann, A. Guthausen, R. Haken, U. Schmitz, K. Saito, G. Zimmer, The NMR-mouse: construction, excitation, and applications, Magnetic Resonance Imaging 16 (5-6) (1998) 479-484. doi:10.1016/s0730-725x(98)00069-1.

M. M. Ross, G. R. Wilbur, P. F. J. C. Barrita, B. J. Balcom, A portable, submersible, MR sensor—the proteus magnet, Journal of Magnetic Resonance 326 (2021) 106964. doi:10.1016/j.jmr.2021.106964.

J. Guo, M. M. B. Ross, B. Newling, B. J. Balcom, Non-Newtonian fluid velocity profiles determined with simple magnetic resonance spin echoes, Phys. Rev. Applied 16 (2021) L021001.doi: 10.1103/PhysRevApplied.16.L021001.

J. Guo, M. M. B. Ross, B. Newling, M. Lawrence, B. J. Balcom, Laminar flow characterization using low-field magnetic resonance techniques, Physics of Fluids 33 (10) (2021) 103609. doi:10.1063/5.0065986.

E. M. Mudge, G. Mazzanti, Rheo-NMR measurements of cocoa butter crystallized under shear flow, Crystal Growth & Design 9 (7) (2009) 3111-3118. doi:10.1021/cg800999y.

M. M. Cross, Rheology of non-newtonian fluids: A new flow equation for pseudoplastic systems, Journal of Colloid Science 20 (5) (1965) 417-437. doi:10.1016/0095-8522(65)90022-x.

P. J. Carreau, Rheological equations from molecular network theories, Transactions of the Society of Rheology 16 (1) (1972) 99-127. doi:10.1122/1.549276.

M. Jastrzebski, H. A. Zaidani, S. Wronski, Stability of couette flow of liquids with power law viscosity, Rheologica Acta 31 (3) (1992) 264-273. doi:10.1007/bf00366505.

M.-K. Yi, K. Chongyoup, Experimental studies on the taylor instability of dilute polymer solutions, Journal of Non- Newtonian Fluid Mechanics 72 (2-3) (1997) 113-139.

J Stepisnik. Analysis of NMR self-diffusion measurements by a density matrix calculation, Physica B+C 104 (3) (1981) 350-364. doi:10.1016/0378-4363(81)90182-0.

D. O. Kuethe, R. J. Herfkens, Fluid shear and spin-echo images, Magnetic Resonance in Medicine 10 (1) (1989) 57-70. doi:10.1002/mrm.1910100106.

I. Mastikhin, L. Hetherington, R. Emms, Oscillating gradient measurements of fast oscillatory and rotational motion in the fluids, Journal of magnetic resonance 214 (2012) 189-99. doi:10.1016/j.jmr.2011.11.003.

A. N. Garroway, Velocity measurements in flowing fluids by MNR, Journal of Physics D: Applied Physics 7 (14) (1974) L159-L163. doi:10.1088/0022-3727/7/14/103.

S. Meiboom, D. Gill, Modified spin-echo method for measuring nuclear relaxation times, Review of Scientific Instruments 29 (8) (1958) 688-691. doi:10.1063/1.1716296.

H. Y. Carr, E. M. Purcell, Effects of diffusion on free precession in nuclear magnetic resonance experiments, Phys. Rev. 94 (1954) 630-638. doi:10.1103/PhysRev.94.630.

C. Van Den Broeck, Taylor dispersion revisited, Physica A: Statistical Mechanics and its Applications 168 (2) (1990) 677-696. doi:https://doi.org/10.1016/0378-4371(90)90023-L.

S. L. Codd. B. Manz, J. D. Seymour. P. T. Callaghen, Taylor dispersion and molecular displacements in poiseuille flow, Phys. Rev. E 60 (1999) R3491-R3494. doi:10.1103/PhysRevE.60.R3491.

A. Lutti, P. Callaghan, Measurement of diffusion in the presence of shear flow, Journal of Magnetic Resonance 180 (1) (2006) 83-92. doi:10.1016/j.jmr.2006.01.009.

G. Bodenhausen, R. Freeman, G. A. Morris, A simple pulse sequence for selective excitation in fourier transform NMR, Journal of Magnetic Resonance (1969) 23 (1) (1976) 171-175. doi:10.1016/0022-2364(76)90150-5.

M. Todica, B. Blumich, Optimization of the DANTE Pulse Sequence for Selective NMR Excitation in Strongly Inhomogeneous Magnetic Fields, International Journal of Modem Physics B 18 (10n11) (2004) 1571-1579. doi:10.1142/s0217979204024896.

J. C. Garcia-Naranjo, I. V. Mastikhin, B. G. Colpitts, B. J. Balcom, A unilateral magnet with an extended constant magnetic field gradient, Journal of Magnetic Resonance 207 (2) (2010) 337-344. doi:10.1016/j.jmr.2010.09.018.

S. Ahmadi, A. R. Aguilera, B. Macmillan, I. Mastikhin, Studies of periodic seawater spray icing with unilateral nmr, Journal of Magnetic Resonance 334 (2022) 107109. doi:https://doi.org/10.1016/j.jmr.2021.107109.

T. Benson, P. Mcdonald, Profile amplitude modulation in stray-field magneticresonance imaging, Journal of Magnetic Resonance, Series A 112 (1) (1995) 17-23. doi:10.1006/jmra.1995.1004.

T. Blythe, A. Sederman, J. Mitchell, E. Stitt, A. York, L. Gladden, Characterising the rheology of non- newtonian fluids using PFG-NMR and cumulant analysis, Journal of Magnetic Resonance 255 (2015) 122- 131. doi:10.1016/j.jmr.2015.03.015.

B. L. Dekkers, D. W. De Kort, K. J. Grabowska, B. Tian, H. V. As, A. J. Van Der Goot, A combined theology and time domain NMR

(56) References Cited

OTHER PUBLICATIONS approach for determining water distributions in protein blends, Food Hydrocolloids 60 (2016) 525-532. doi:10.1016/j.foodhyd. 2016.04.020.

* cited by examiner

MAGNETIC RESONANCE METHOD AND SYSTEM FOR CHARACTERIZING CIRCULAR COUETTE FLOW OF FLUIDS

CROSS-REFERENCE TO RELATED APPLICATION

This application claims the benefit of U.S. Provisional Patent Application Ser. No. 63/399,952 filed Aug. 22, 2022.

FIELD

In one of its aspects, the present disclosure relates generally to a method and system for characterizing circular Couette flow of fluids.

BACKGROUND

Even prior to the invention of magnetic resonance imaging (MRI) [1], nuclear magnetic resonance (NMR) has found recurring applications in rheological measurements with varying degrees of complexity [2, 3, 4]. Over the years, the methods for characterizing fluid flow using NMR have improved significantly, allowing for the characterization of increasingly complex flow regimes [5, 6, 7, 8, 9]. MRI-based methods can provide significant advantages over conventional rheometric techniques that characterize macroscopic properties such as the force or torque exerted on a boundary and the relative velocity between boundaries. Bulk measurements of rheological properties are then deduced by assuming that the material and the shear rate are homogeneous in the gap between boundaries [5]. Sophisticated MRI-based methods offer spatial resolution that carries information on the inner structures of a flow system. Furthermore, unlike optical scattering methods, NMR allows for the characterization of opaque samples. Rheological-NMR (Rheo-NMR) methods have been applied in many fields such as: food science [10, 11], biomedicine [12, 13], and pharmaceuticals [14, 15]. While informative, conventional methods often require large and expensive MRI scanners and can be difficult to implement without extensive experience in NMR.

Several low-field Rheo-NMR techniques have previously been developed that employ permanent magnet systems in the characterization of rheological properties. Some techniques integrate permanent magnet arrays into commercially available rheometers [12, 16] and measure NMR relaxation parameters in conjunction with rheological properties. Others make use of permanent magnets and gradient coils to image velocity distributions [17], requiring a relatively large and homogeneous instrument (approx. 150 kg).

Portable, low-field NMR sensors such as the NMR MOUSE [18] and more recent developments such as the PROTEUS magnet for flow allow for an alternative approach to be considered. While being more compact and affordable, portable magnets offer many advantages typically associated with NMR.

Reduced size and cost require sacrificing field homogeneity and sensitivity; therefore, portable NMR sensors are not as versatile as conventional MRI scanners and are often designed and optimized around a specific class of applications. Various techniques have been developed that employ portable, low-field instruments in flow characterization.

Previous work has shown that the flow behavior of non-Newtonian fluids can be characterized by employing simple constant gradient magnet arrays and observing the signal phase interference caused by the velocity distribution within the sensitive volume [20, 21]. While the size and cost of the NMR instrumentation are significantly reduced, pipe flow methods often require complex flow networks and large sample volumes (>10 L).

SUMMARY

In one aspect, the present disclosure relates to a novel method for characterizing circular (laminar) Couette flow of fluids, particularly non-Newtonian fluids, and also Newtonian fluids. Symmetry of the flow system combined with a constant magnetic field gradient leads to phase interference, affecting the signal magnitude, and net phase cancellation when averaging across an excited slice, preventing the use of phase-sensitive methods. Therefore, utilized is the dependence of signal magnitude at variable echo times and shear rates to characterize rheological properties. In one aspect, equations, as detailed in the present disclosure, governing the velocity distributions of fluids that obey a simple power-law model are used to obtain integral expressions for signal magnitude. Integral expressions can be simplified by approximating a thin excited slice or complete excitation of the Couette cell depending on experimental parameters. In one aspect, with simple data acquisition and analysis procedures employed, measurements of the flow behavior indices of non-Newtonian xanthan gum dispersions are in close agreement with conventional rheological magnetic resonance measurements.

The present disclosure in one aspect relates to a method for measuring the flow behavior index using a low-cost portable NMR instrument and a circular Couette flow system, wherein rotation effects are encoded in a first echo acquired with a variable echo time and optional subsequent echoes with short echo times are acquired. In one aspect, a short echo time is shorter than or equal to the shortest variable echo time, in another aspect a short echo time is on the order of tens of microseconds, in another aspect, a short echo time is in the range of about 200 µs to about 400 µs and in another aspect, a short echo time is an echo time that is as short as is achievable with the NMR instrumentation used.

In one aspect, the present disclosure relates to a method of characterizing flow behavior of a fluid sample including i) providing a magnet with a static magnetic field and a constant gradient where at least a portion of the sample defining a sensitive region is in the constant gradient, ii) inducing circular Couette flow in the fluid in at least the sensitive region and providing a rotation speed of the sample, iii) generating an NMR pulse sequence comprising at least two pulses with a delay between the pulses, iv) acquiring at least one echo from the pulse sequence from the sensitive region, v) measuring the magnitude of the NMR signal of the at least one acquired echo, vi) normalizing the measured magnitude to a reference magnitude, and vii) determining a flow behavior index for the fluid sample though fitting the measured magnitudes using a numerical integration equation.

In another aspect, the present disclosure relates to an NMR system including a portable unilateral magnet having a constant gradient perpendicular to a surface of the magnet, a tubular stator vessel suitable for holding a sample fluid, wherein the stator is adjacent the surface and at least partially located in the constant gradient, a tubular rotor located inside of the stator vessel along the central longitudinal axis of the stator vessel, a motor operably connected to the tubular rotor for rotating the rotor around the central axis, a radio frequency coil around the tubular stator, and an NMR console operably connected to the radio frequency coil. In another aspect, the present disclosure further includes a computer system wherein the computer system including computer program instructions for computer implemented steps including generating an NMR pulse sequence comprising at least two pulses with a delay between the pulses, acquiring at least one echo from the pulse sequence from the sensitive region, measuring the magnitude of the NMR signal of the at least one acquired echo, normalizing the measured magnitude to a reference magnitude, and determining a flow behavior index for the fluid sample though fitting the measured magnitudes using a numerical integration equation. In another aspect, the inner tube can serve as the stator and the outer tube rotated as the rotor.

The present disclosure, in certain aspects, has several advantages over conventional Rheo-NMR techniques including increased accessibility; an ability to be easily combined with other measurements; and reduced sample volume. Furthermore, in one embodiment, velocity profiles can be recovered in one-shot by simply inserting the fitted value of the flow behaviour index with the independently measured rotor speed into a model.

In another aspect, the present disclosure includes two optional methods for calibrating a measurement made according to methods of the present disclosure: (i) comparing to a Newtonian or non-Newtonian reference sample and (ii) comparing the magnitudes of slices generated by a composite 90° DANTE pulse.

In aspects of the present disclosure, procedures for data acquisition and analysis are relatively simple and approachable and avoid unnecessary complexity.

Measurements acquired thus far suggest that the most logical direction to proceed is to employ a magnet with a weaker gradient. A weaker gradient has the advantage of limiting diffusive attenuation and would provide increased sensitivity to flow effects at longer echo times and allow for further exploration of DANTE excitation of water-based samples, potentially allowing for the observation of flow effects in multiple thin slices of the sample. In one aspect, a thin slice is less than 10% of the sample diameter. Furthermore, a weaker gradient allows for excitation of thicker slices and verification of the complete coverage approximation to the signal equation. In one aspect, a thicker slice is equal in thickness to the diameter of the sample. In one aspect, a weaker gradient is in the range of about 50 G/cm to about 250 G/cm. In another aspect, a gradient strength is chosen so as to minimize the sensitivity of measurements to diffusion while maintaining sufficient sensitivity to rotation during measurement. In another aspect, the gradient is about 50 G/cm which corresponds in one set-up to a slice diameter of about 1 cm. In another aspect, measurement sensitivity to rotation can be increased by increasing the rotation speed of the rotor in the NMR set-up up to the point where the rotation speed induces turbulence in the fluid sample.

BRIEF DESCRIPTION OF THE DRAWINGS

Embodiments of the present invention will be described with reference to the accompanying drawings, wherein like reference numerals and reference letters denote like parts, and in which.

DETAILED DESCRIPTION

Figure 1:
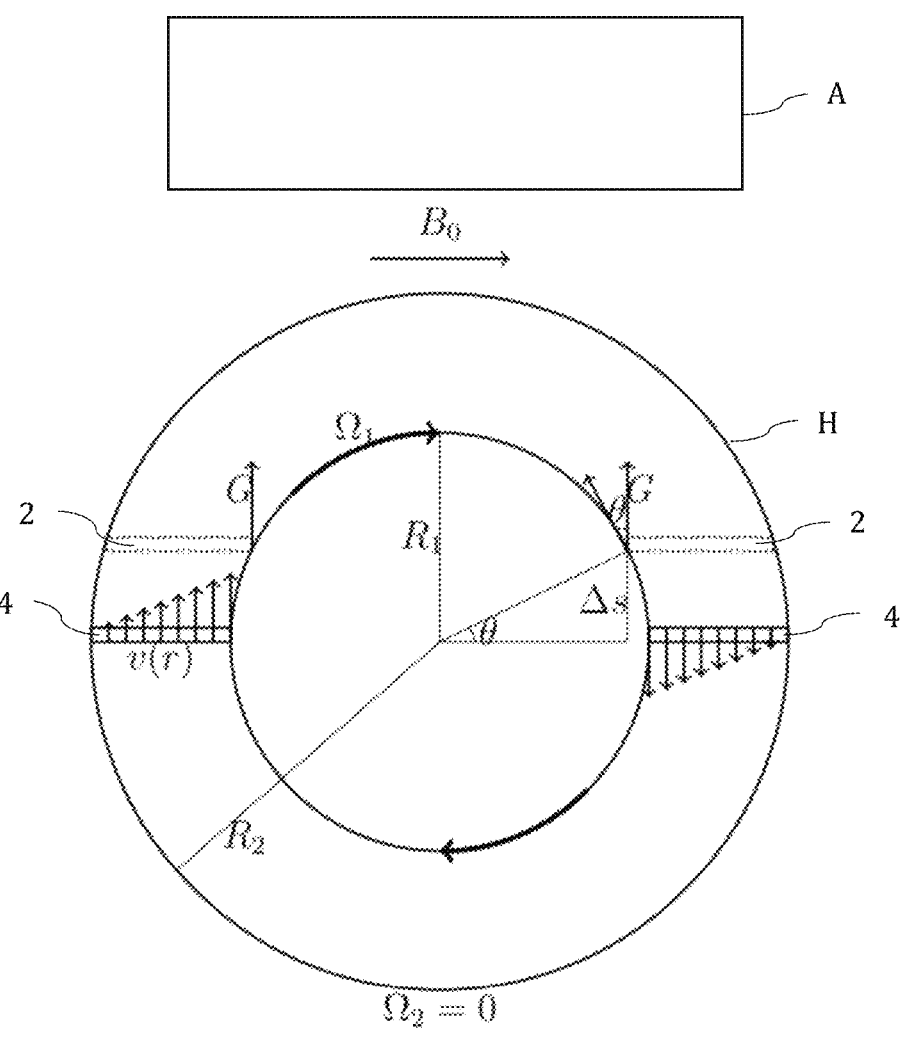
FIG. 1 is a diagram of the geometry of a Couette flow system showing a cross-section of plastic sample tube (H) shown in FIG. 5 and FIG. 12. Solid rectangle pairs 2 and stippled rectangle pairs 4 are cross-sections of exemplary excited slices which run along the longitudinal axis of sample tube (H): a) solid rectangles 4 delineate a perfectly centered slice where velocity points parallel/antiparallel to the gradient and b) stippled rectangles 2 delineate a slice offset by $\Delta s$ where the component of the velocity parallel/antiparallel to the gradient is given by $v_\theta(r)\cos\theta$.

Various systems and methods will be described below to provide an example of an embodiment of each claimed invention. No embodiment described below limits any claimed invention and any claimed invention may cover systems or methods that differ from those described below. The claimed inventions are not limited to systems or methods having all of the features of any one system or method described below or to features common to multiple or all of the systems and methods described below. It is possible that a system or method described below is not an embodiment of any claimed invention. Any invention disclosed in a system or method described below that is not claimed in this document may be the subject matter of another protective instrument, for example, a continuing patent application, and the applicants, inventors or owners do not intend to abandon, disclaim, or dedicate to the public any such invention by its disclosure in this document.

While the teaching herein includes illustrative embodiments and examples of some aspects of an invention, the description is not intended to be construed in a limiting sense. Thus, various modifications of the illustrative embodiments, as well as other embodiments of the invention, may be apparent to persons skilled in the art upon reference to this description. It is therefore contemplated that the appended claims will cover any such modifications or embodiments.

All publications, patents, and patent applications referred to herein are incorporated by reference in their entirety to the same extent as if each individual publication, patent, or patent application was specifically and individually indicated to be incorporated by reference in its entirety.

The present invention, in one embodiment, relates to a novel method for characterizing laminar flow between concentric rotating cylinders, known as circular Couette flow (CCF). The main advantage of the CCF method of one embodiment of the present invention is found in: its increased accessibility due to reduced size and cost; its ability to be easily combined with conventional rheometers or optical techniques such as synchrotron x-ray diffraction [22]; and its small sample volume.

Acquisition of signal from a rectangular slice across the sample combined with net phase cancellation due to the symmetry of the flow system prevents the application of phase-sensitive methods. However, the signal phase interference from various elements of flow determined by the radial dependence of the velocity distribution, will lead to the reduction in signal magnitude. Therefore, the present invention in one embodiment utilizes a magnitude-based approach to characterize the flow behavior of non-Newtonian fluids.

With the Couette cell positioned inside the sensitive region of a constant gradient unilateral three-magnet array, the rheological dependence of signal decay is observed as a function of echo time. The strong magnetic field gradient (254 G/cm) limits the excited volume to a thin (<1 mm) slice of the sample. Incidentally, a thin slice provides a convenient approximation to the signal equation and greatly simplifies the analysis. Proof of concept measurements have been performed on low concentration dispersions of xanthan gum in distilled water, a shear thinning fluid that follows a simple power-law model. After calibration, measurements of the flow behavior index, n, are in close agreement with conventional Rheo-NMR measurements from the literature. In addition to demonstrating the effectiveness of the present technique, xanthan gum samples also outline practical considerations for potential future experiments on more complex fluids.

6

Theory
Fluid Mechanics Theory

Newtonian fluids have the simplest description of flow behavior with the shear stress, $\sigma$, proportional to the shear rate, $$\sigma = \mu\dot{\gamma} \tag{1}$$

where $\mu$ is the viscosity of the fluid, and $\dot{\gamma}$ is the shear rate proportional to the velocity gradient normal to the shear stress. Note that the viscosity is completely independent of the shear rate and shear stress, meaning that the resultant flow curve shows a linear relationship between shear stress and shear rate. In CCF, the shear rate can be approximated as follows [23], $$\dot{\gamma} = \frac{R_1}{R_2 - R_1}\int_{R_2}^{R_1}\frac{\dot{\gamma}(r)}{r}dr \approx \frac{v}{d} \tag{2}$$

where $\dot{\gamma}$ is the shear rate, v is the linear velocity at the inner wall, d is the gap size, $R_1$ and $R_2$, are the radii of the inner and outer cylinders, and v is the kinematic viscosity.

Non-Newtonian fluids can be generally described as fluids for which the "apparent viscosity" is dependent on the shear rate, meaning that the flow curve shows a non-linear relationship between stress and strain, and may have a non-zero intercept. Various models have been developed for different fluids that fit this general description. Beginning with the simplest case of a power-law model [24], $$\sigma = m\dot{\gamma}^n \tag{3}$$

where the exponent, n, is termed the flow behavior index, and the coefficient, m, is the flow consistency index. Note that setting n equal to unity recovers the case of a Newtonian fluid where m describes the viscosity. Fluids can be further classified as shear thinning if n is less than unity, or shear thickening if n is greater than unity.

The power-law model provides a simple assessment of non-Newtonian flow; however, it is restricted to a limited range of shear rates and does not predict zero and infinite shear viscosities [24]. Limitations of the power-law model have been addressed in four parameter models such as the Cross viscosity equation and the Carreau viscosity equation describing shear thinning fluids. Other models exist for more complex fluids such as viscoplastic fluids, in which a certain yield stress must be exceeded before the fluid begins to flow. Examples of viscoplastic models include; the Bingham plastic model and its generalization for non-Newtonian fluids, the Herschel-Buckely model, both of which include yield stress constants [23].

Although the power-law model is sufficient to provide predictions in an embodiment of the present invention, previous work in NMR rheology has applied other models to characterize the flow of complex fluids [6]. As long as a sample is MR sensitive, the acquisition and analysis procedures outlined in the present specification can be modified for use with a relevant model.
Couette Flow and Instabilities Couette flow is defined as the flow of fluid between concentric rotating cylinders. The velocity distribution in the gap between the cylinders can most generally be described as follows [27], $$V(r) = Ar + \frac{B}{r} \tag{4}$$

with coefficients A and B dependent on the rotation rates of the inner and outer cylinders, $\Omega_1$ and $\Omega_2$, and their radii $R_1$ and $R_2$. In an embodiment of the present invention, the outer cylinder (stator) is fixed and the inner cylinder (rotor) is rotated at a constant rate. In this simplification, A and B are defined as follows, $$A = \frac{-\eta^2 \Omega_1}{1 - \eta^2} \tag{5}$$

$$B = \frac{R_1^2 \Omega_1}{1 - \eta^2}$$

where $\eta$ is the radius ratio, $$\frac{R_1}{R_2}.$$

Components of the velocity distribution are obtained by solving the linearized Navier-Stokes equation in cylindrical coordinates. For laminar flow—often referred to as circular Couette flow (CCF)—the flow is axisymmetric and the velocity distribution can be described analytically. For a power-law fluid with non-slip boundary conditions, the azimuthal component of the velocity distribution is given by [28], $$v_\theta(r) = r\Omega_1 \left[ \frac{1 - \left(\frac{r}{R_2}\right)^{\frac{-2}{n}}}{\left(1 - \eta^{\frac{-2}{n}}\right)} \right] \tag{6}$$

For a Newtonian fluid (n=1), the above expression is reduced to, $$v_\theta(r) = \Omega_1 \frac{r - \frac{R_2^2}{r}}{1 - \eta^{-2}} \tag{7}$$

As the shear rate increases, axisymmetric disturbances grow exponentially and the flow becomes unstable, resulting in the formation of vortices in the axial direction (Taylor Vortex Flow). The onset of instabilities can be estimated using the Taylor number, defined in the narrow gap approximation as, $$T = \frac{\Omega_1^2 r_1^2 d^3}{v^2} \tag{8}$$

where d is the gap width, $R_2$–$R_1$, and v is the kinematic viscosity. In the narrow gap approximation, the critical Taylor number, $T_c$ is approx. 1700. In an embodiment of the present invention, an object is to maintain laminar flow, as the instrument is only sensitive to flow in the direction of the magnetic field gradient. $T_c$ can be verified experimentally by observing the shear rate at which the measured magnitudes begin to deviate from theoretical predictions for laminar flow. A more sophisticated analysis can be used to describe the Taylor number for non-Newtonian fluids [23]; however, previous work has shown that for dilute solutions of xanthan gum in water, the critical Taylor number is close to that of water [29].

Magnetic Resonance Methods for Measuring Flow

The most common and straightforward method in motion-sensitized NMR encodes the velocity in measurements of phase. In the presence of a gradient, the NMR signal phase accumulates according to [30], $$\phi = \int \gamma \vec{G}(t) \cdot \vec{r}(t) dt \tag{9}$$

where $\gamma$ is the gyromagnetic ratio. Assuming that the velocity remains constant over the time of the echo, the position $\vec{r}$(t) can be approximated using a Taylor expansion.

Expanding to first order, the phase at the first echo is given by, $$\phi(2\tau) = \phi_0 + \gamma \vec{G} \cdot \vec{v} \tau^2 \tag{10}$$

where $\phi_0$ is the phase associated with a stationary sample. After normalizing to the stationary sample signal to eliminate relaxation/diffusion effects, the motion-sensitized NMR signal is given by, $$S = \int_{R_1}^{R_2} \rho(r) \int_{\theta_1}^{\theta_2} e^{-i\phi(r)} r \, dr \, d\theta \tag{11}$$

In many cases, direct measurements of phase can be used to extract information on the flow velocity. However, as shown in FIG. 1, the symmetry of the Couette flow system leads to a net cancellation of phase, preventing the use of phase-sensitive methods for measuring flow velocity. Instead, the present inventors can consider velocity induced phase-interference which leads to an overall attenuation of signal magnitude, similarly to past conventional MR measurements of rotational flow [31, 32].

Taking the component of the flow velocity in the direction of the gradient, the signal is given by, $$S = \int_{R_1}^{R_2} \rho(r) \int_{\theta_1}^{\theta_2} e^{-i(\gamma G v_\theta(r) \cos\theta \tau^2)} r \, dr \, d\theta \tag{12}$$

Assuming the spin density distribution $\rho$(r), is uniform within the excited slice, the present inventors normalize it as $\rho$(r)=1.

The above integral expression can be simplified using one of two approximations. First, the integration over $\theta$ can be eliminated by assuming a very thin excited volume of the sample. In this approximation, the present inventors can separate the contributions from spins with opposing veloci ties on either side of the sample and the signal at the first echo is given by, $$S = \int_{R_1}^{R_2} e^{(-i\gamma Gv_\theta(r)\cos\theta\tau^2)}rdr + \int_{R_1}^{R_2} e^{(i\gamma Gv_\theta(r)\cos\theta\tau^2)}rdr = \tag{13}$$

$$\int_{R_1}^{R_2} \cos(\gamma Gv_\theta(r)\cos\theta\tau^2)rdr$$

The signal is most sensitive to flow when the velocity is parallel/anti-parallel to the gradient ($\theta=0$). Practically this is not always possible and measurement of the angle, $\theta$, between the velocity and the gradient is required.

The present inventors can measure $\theta$ indirectly using a Newtonian reference sample, or directly using a method described below in section "DANTE pulses for calibration".

The present inventors bring attention to the similarity of Equation 13 and the following equation described in [33], $$S(t) = \int_0^\infty dv\rho(v)\cos\left(\frac{1}{2}\gamma Gv\tau t\right) \tag{14}$$

In Equation 13, a factor describing the spin distribution of velocity, $\rho(v_\theta)$, is absent, and signal integrated over the spatial dimensions of the flow cell. Given that flow is laminar, it is reasonable to assume that the velocity distribution is stationary. Therefore, each position corresponds to a single velocity, and the distribution of velocities can be described as a delta function, $\rho(v_\theta)=\delta(v-v_\theta(r))$.

In an alternative approximation, one can assume that the excited slice completely covers the sample. In this case, the integration over $\theta$ leads to a Bessel function of the first kind and the signal is given by, $$S = 2\pi \int_{R_1}^{R_2} J_0(\gamma Gv_\theta(r)\tau^2)rdr \tag{15}$$

In both approximations, the radial part was integrated numerically. Although current instrumentation does not allow for complete excitation of the sample, it is still useful to investigate the expected behaviour in simulation.

In theory, the above expressions are valid for all echoes; however, imperfect RF pulses in conjunction with an inhomogeneous magnetic field can generate coherence pathways that interfere with later echoes. This makes quantitative characterization the flow behavior index using multiple echoes in a Carr-Purcell-Meiboom-Gill (CPMG) echo train difficult. Therefore, flow effects are encoded in the first echo.

Effects of $T_2$ and Diffusion

In addition to flow effects, the signal will also be attenuated further by the transverse relaxation time, $T_2$, and diffusion as follows [35], $$S = \exp\left[-2\frac{\tau}{T_2} - \frac{2}{3}\gamma^2 G^2 D\tau^3\right] \tag{16}$$

where D is the self-diffusion coefficient. Normalizing the signal to that of a stationary sample allows for diffusion and $T_2$ effects to be neglected, assuming that shear flow has a negligible effect on the "apparent" self-diffusion coefficient. Echo times and the strength of the magnetic field must be carefully considered to ensure that the remaining signal after diffusive attenuation and $T_2$ relaxation is sufficient to normalize and resolve flow effects.

Effects of Taylor Dispersion

Taylor dispersion is a process by which fluid elements are dispersed around the average direction of motion in a diffusion-like manner. Dispersion manifests as an apparent increase in diffusive attenuation of signal and can lead to incorrect measurements of flow parameters. Dispersion of fluid elements in the direction of flow is typically negligible for laminar flow [36]; therefore, when observing Couette flow, one must only consider perturbations to the apparent self-diffusion coefficient due to dispersion in the radial direction. This contribution is difficult to quantify using portable NMR; however, conventional PFG techniques have previously been employed to investigate the effects of Taylor dispersion in various flow geometries [37, 38]. Modifying the expression to account for a static gradient, the increase in apparent diffusivity in the radial direction due to Taylor dispersion, $D_{Flow}$, is given by, $$D_{Flow} = \frac{3}{16}\langle \Delta v_r(r)^2 \rangle \tau \tag{17}$$

where $\langle \Delta v_r(r) \rangle$ is the average change in the radial component of velocity over the time of the acquisition. For sufficiently low shear rates and gap sizes, $\Delta v_r(r)$ is small and $D_{Flow}$ can be neglected.

DANTE Pulses for Calibration

Practically, it can be difficult to ensure perfect alignment of thin slices with the centre of the Couette cell. As described above, it is often necessary to calibrate the measurement by determining the angle, $\theta$, between the velocity and the magnetic field gradient. One possibility is calibrating to a Newtonian reference sample ($n=1$); however, this requires changing the sample prior to the measurement. An alternative and more practical approach is to apply a composite 90° DANTE pulse. DANTE (Delays Alternating with Nutation for Tailored Excitation) was developed as an alternative method for selective excitation [39] and has since been optimized for use in inhomogeneous fields [40]. DANTE calibration does not require a Newtonian reference sample and can be used to quickly determine the offset of the excited slice from the center of the Couette cell and by extension, the component of velocity in the direction of the magnetic field gradient. Rather than exciting the sample with a "hard" 90° pulse, N short pulses separated by a delay, $\delta$, are applied resulting in transverse magnetization within N small slices of the sample separated by a distance, $\Delta x$, given by, $$\Delta x = \frac{2\pi}{\gamma G\delta} \tag{18}$$

Following the DANTE pulse, "hard" 180° refocusing pulses can be applied to generate spin echoes. Taking the Fourier transform of the echo reveals a 1D profile with N distinct peaks. If the sample is perfectly aligned, the profile should be symmetric. If the profile is asymmetric, a simple geometric argument, described in appendix A can be used to determine the offset from centre, and by extension the angle, $\theta$, between the velocity and magnetic field gradient. This procedure can become complicated if a slice is positioned outside of the inner cylinder, or on the boundary between the two cylinders. Therefore, the present inventors provide a two-step calibration procedure. First, a DANTE measurement on a continuous sample to correct for larger offsets if necessary, followed by a second measurement with the rotor in position to make fine adjustments.

Simulations

Current Gradient Simulations

Figure 2:
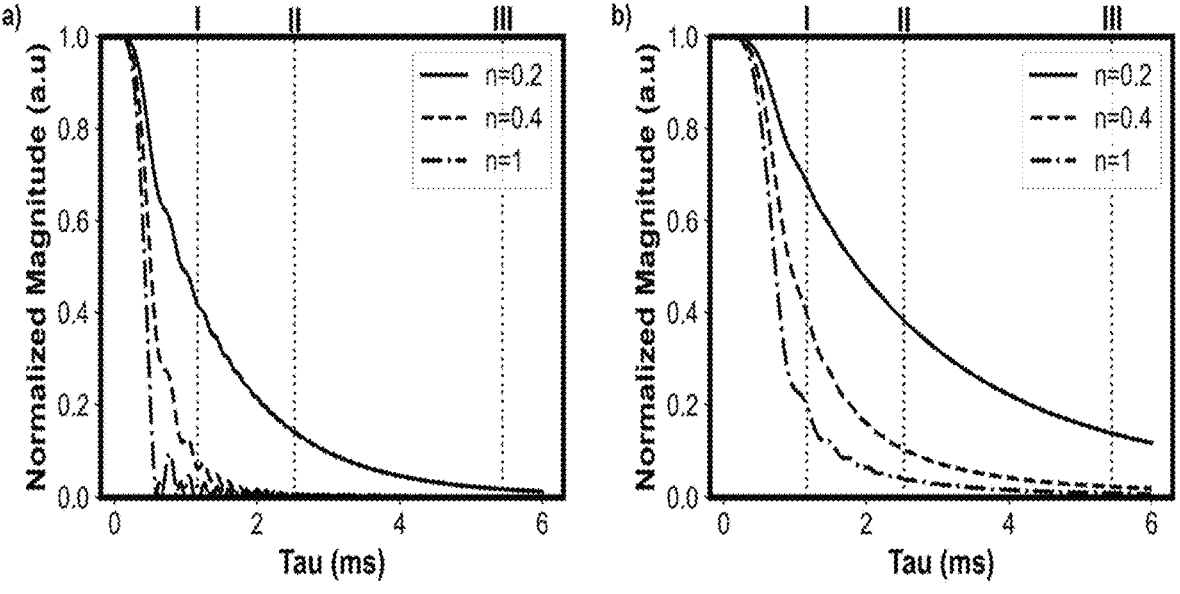
FIG. 2 are two graphs of a normalized first echo magnitude plotted against $\tau$ for a shear rate of 4.85 s$^{-1}$ for a) a thin excited slice, and b) complete coverage of the sample for a gradient of 254 G/cm. Flow behaviour indices of; n=0.2 (solid line), n=0.4 (dashed line), and n=1 (dash-dot line) are shown. Vertical dotted lines indicate the point at which diffusion attenuates signal by a factor of e for diffusion coefficients of; I) water (2 $\mu$m$^2$/ms), II) 0.2 $\mu$m$^2$/ms, and III) 0.02 $\mu$m$^2$/ms.

The current magnetic field gradient (254 G/cm) provides sufficiently close agreement with the thin slice approximation of the signal equation. Simulations were used to select acquisition parameters in this approximation and compared with simulations of the complete coverage approximation. FIG. 2 shows the dependence of signal magnitude (normalized to that of a stationary sample) on echo time ($2\tau$). Flow behaviour indices of; $n=0.2$ (solid line), $n=0.4$ (dashed line), and $n=1$ (dash-dot line) are shown, each at a shear rate of $4.85$ s$^{-1}$. Normalization of signal to that of a stationary sample leads to decreased sensitivity to flow effects at longer echo times due to $T_2$ relaxation and more prominently, diffusive attenuation. To investigate the effects of diffusion, the present inventors have determined the $\tau$ values at which diffusion leads to a reduction in the stationary sample signal by a factor of e. These values are indicated by vertical dotted lines for diffusion coefficients of: I) water ($2$ $\mu$m$^2$/ms), II) $^1/_{10}$ of water ($0.2$ $\mu$m$^2$/ms), and III) $^1/_{100}$ of water ($0.02$ $\mu$m$^2$/ms). Note that it becomes difficult to resolve the complete decay of signal for samples with diffusion coefficients that are close to that of water.

Alternatively, the effects of diffusion can be held constant by acquiring signal at a fixed echo time and varying the shear rate. However, the longer echo times needed to resolve significant flow effects result in decreased initial magnitude and a correspondingly decreased SNR for the entire measurement. This makes variable shear rate methods impractical for the current samples and magnet. Furthermore, multiple measurements of the shear rate can add to the uncertainty of the measured flow behaviour index. The simplest way to overcome the need for longer echo times for a given gradient is to use a sample with a smaller diffusion coefficient. Although SNR would be improved for such samples, this is not a viable solution as it would restrict the technique to a limited set of fluids.

Weaker Gradient Simulations

In both of the proposed measurements—variable echo time and variable shear rate—the present inventors see that their effectiveness can be improved by reducing the magnetic field gradient. The advantage of using a weaker gradient is two-fold. Most importantly, lowering the gradient significantly reduces the effects of diffusive attenuation and improves sensitivity. Furthermore, a weaker gradient allows for excitation of larger slices of the sample, and possible verification of the complete coverage approximation (Equation 15). For the same bandwidth as the current RF probe (approx. 200 kHz), the present inventors can determine the gradient needed to excite a 1 cm slice that completely covers the sample. Using the following equation, the gradient needed is approx. 50 G/cm, $$\Delta x = \frac{2\pi\Delta f}{\gamma G} \tag{19}$$

Figure 3:
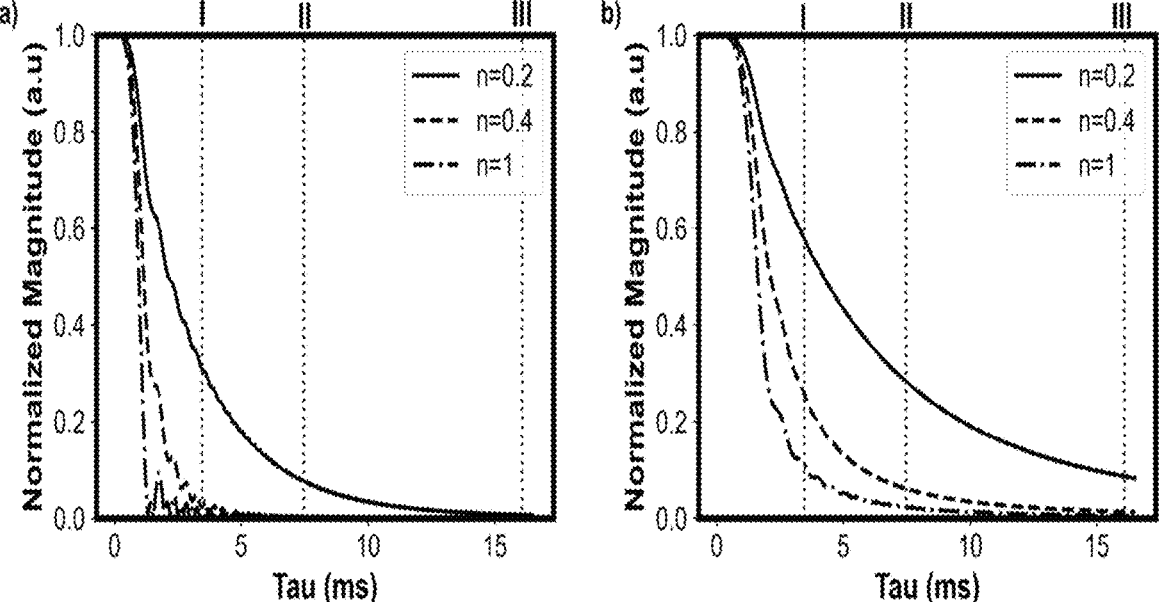
FIG. 3 are two graphs of normalized first echo magnitude plotted against $\tau$ for a shear rate of 4.85 s$^{-1}$ for a) a thin excited slice, and b) complete coverage of the sample for a gradient of 50 G/cm. Flow behaviour indices of; n=0.2 (solid line), n=0.4 (dashed line), and n=1 (dash-dot line) are shown. Vertical dotted lines indicate the point at which diffusion attenuates signal by a factor of e for diffusion coefficients of; I) water (2 $\mu$m$^2$/ms), II) 0.2 $\mu$m$^2$/ms, and III) 0.02 $\mu$m$^2$/ms.

FIG. 3 shows the same simulations as FIG. 2, apart from a weaker gradient (50 G/cm) and a change in scale. In comparing with FIG. 2, the present inventors can expect to resolve an added 10% of flow-induced attenuation before the stationary sample signal is attenuated by a factor of e due to diffusion alone.

Figure 4:
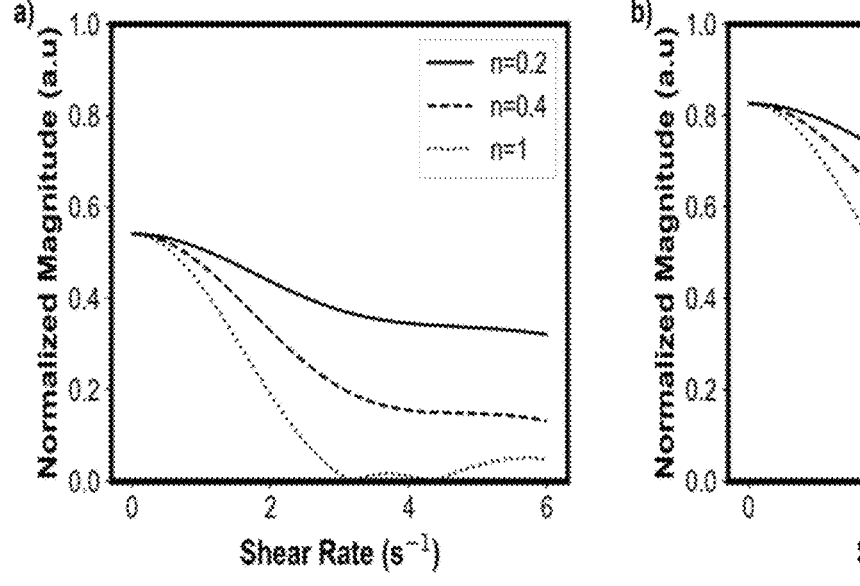
FIG. 4 are two graphs of thin slice simulations of first echo magnitude after diffusive attenuation (D=2 $\mu$m$^2$/ms) plotted against $\dot{\gamma}$ ranging from 0 s$^{-1}$ to 6 s$^{-1}$ for: a) a gradient of 254 G/cm with $\tau$=0.75 ms and b) a gradient of 50 G/cm with $\tau$=1.5 ms. Flow behaviour indices of; n=0.2 (solid line), n=0.4 (dashed line), and n=1 (dash-dot line) are shown.

FIG. 4 shows a comparison between simulations of first echo magnitude at variable shear rates ($0$ s$^{-1}$–$6$ s$^{-1}$) after diffusive attenuation ($D=2$ $\mu$m$^2$/ms) for gradients of 254 G/cm and 50 G/cm. For a gradient of 254 G/cm, the $\tau$ of 0.75 ms needed to resolve flow effects maintains <60% of the initial magnitude after diffusive attenuation. Reducing the gradient to 50 G/cm requires a longer $\tau$ (1.5 ms); however, >80% of the initial magnitude remains after diffusive attenuation.

Experimental

Magnet and RF Coil

Figure 5:
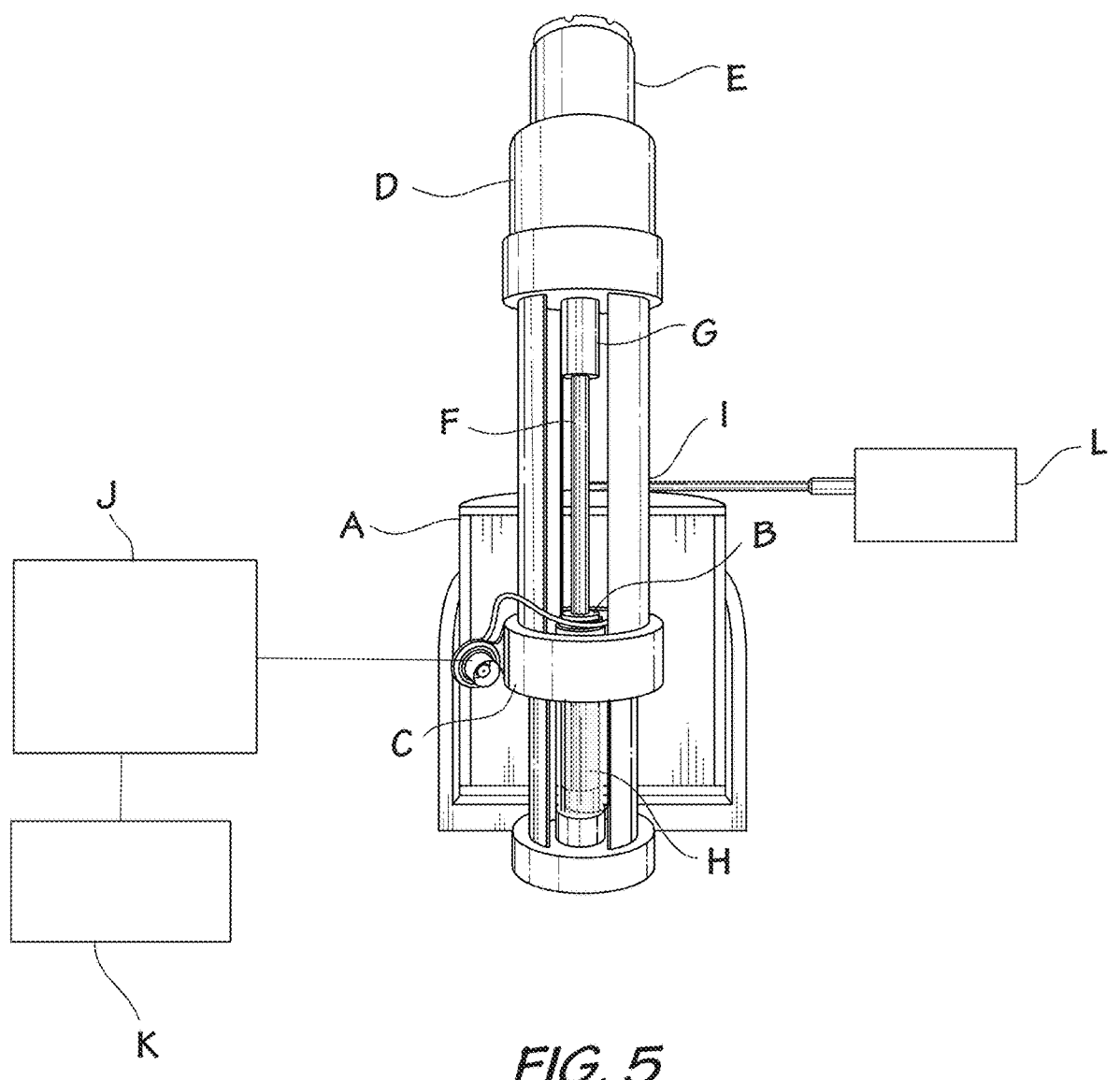
FIG. 5 is a photograph of a portable NMR Couette flow setup using in an aspect of the present disclosure.
Figure 6:
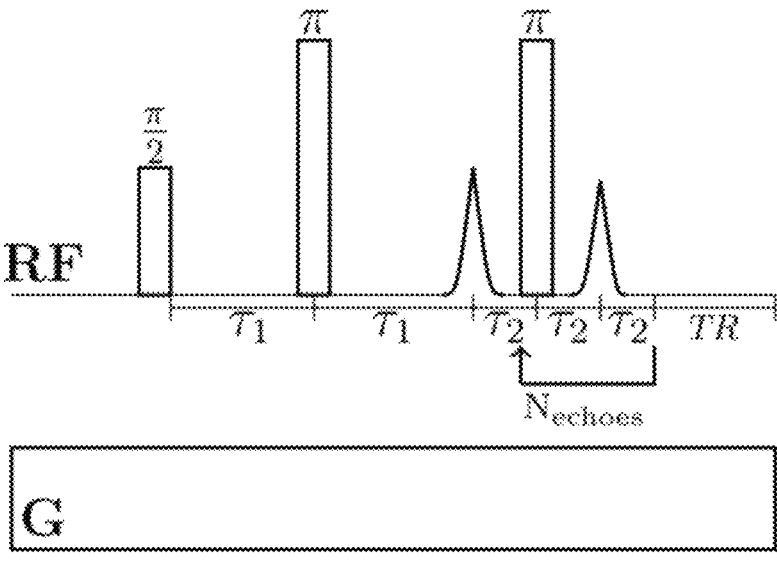
FIG. 6 is a diagram of a pulse sequence employed in Couette flow measurements according to aspects of the present disclosure. $\tau_1$ is varied to form the first echo encoding rotation effects. $N_{echoes}$ are acquired with fixed $\tau_2$ and added together to boost SNR.

The experimental setup, depicted in FIG. 5, employed a unilateral three-magnet array (A) to provide a static magnetic field, $B_0$. The magnet has a constant gradient of 254 G/cm directed perpendicular to its surface [41].

To excite transverse magnetization a radiofrequency with five turns of copper wire (B) generated an oscillating magnetic field, $B_1$, at a frequency of 5.73 MHz (the Larmor frequency approx. 1.5 cm from the surface of the magnet array).The coil consisted of 5 turns of copper wire wound around a 3D printed former with a diameter of 1.1 cm and height of 1.5 cm. Using the reflection mode method [42], the RF probe quality factor was determined. The quality factor of 60 corresponds to a bandwidth of approx. 191 kHz, which limits the slice thickness to a maximum of 1.76 mm [43]. Custom 3D printed hardware (C) was fabricated to position the coil at a fixed distance away from the magnet. Copper tape was wrapped around the coil mount to prevent corruption of echoes by acoustic ringing interactions between the $B_1$ field and the magnet array casing.

Couette Flow Setup

Referring to FIG. 5, a portable NMR Couette flow setup used in an embodiment of the present invention includes a three-magnet array (A), radiofrequency coil (B), 3D printed radiofrequency coil mount (C), motor mount (D), 12 V DC motor (E), garolite inner cylinder (rotor (F)), aluminium shaft (G), plastic sample tube (stator) (H), and fotonic gap sensor (I). An NMR console (J) is operably connected to radiofrequency coil(B) and fotonic gap sensor I) is operably connected to an oscilloscope (L). A computer system (K) is operably connected to NMR console (J) and is programmed with method steps according to embodiments of the present invention.

A separate mount (D) was 3D-printed to suspend a 12 V, 150 RPM DC motor (E) in place above the Couette cell. The mount was designed to provide a safe spacing of 10 cm between the motor and magnet array. The present inventors connected the rotor (a 6 mm diameter Garolite rod (F)) to the motor using an aluminum shaft (G) and set screws. Garolite was selected for several reasons; it produces no MR signal, the surface is smooth with no significant irregularities, and it was readily available in the desired size. The present inventors fitted the opening of the stator (a 10 mm diameter plastic tube (H)) with rotary shaft seals (lubricated with Lithium grease) to maintain alignment of the rotor with the central axis of the stator. The gap size between the rotor ($R_1=3$ mm) and the stator ($R_2=5$ mm) was 2 mm. The motor was driven by the variable DC output of an SDG1025 Arbitrary Waveform-Function Generator (Siglent, CN). For measurement of rotation speeds, a KD-300 Fotonic gap sensor (I) (MTI Instruments, NY) was slotted into the motor mount and connected to a digital oscilloscope.

Data Acquisition and Processing

To acquire MR signal, the RF probe was connected to a duplexer with the transmit end connected to an RF pulse amplifier (Tomco, AU) and the receiving end connected to the input of a pre-amplifier (Miteq, N.Y). The output of the pre-amplifier was connected to a LapNMR console (Tecmag, TX), with a 10.7 MHz low-pass filter (Mini Circuits, N.Y) in-line to reduce noise.

Pulse sequences were configured using NTNMR (Tecmag, TX). For validity of the thin slice approximation, 9 us pulses were attenuated by 23 and 29 dB to generate 90° and 180° pulses, respectively. Pulse widths were set by comparing the amplitudes of the first three echoes in a quadrature echo pulse sequence [44], a perfect 90° pulse should result in a ratio of 1:1.5:1.5. The 9 us pulse results in excitation of a 0.8 mm slice of the sample. 2D tables were included in the pulse sequence to sweep through a range of echo times.

Low sensitivity typically encountered when working with low-field NMR is further exacerbated by the requirement of a thin slice across the narrow gap that contains the sample. Slight improvement in SNR was achieved by sizing the coil former specifically around the sample tube to increase the fill factor. Alternatively, the coil could be wound directly around the sample tube; however this introduces potential influences from vibrations.

SNR can be improved drastically by adding the echoes in a CPMG echo train. The first echo, acquired with a variable echo time, encodes flow effects. Subsequent echoes are acquired with the shortest possible echo time with the intent of maximizing the number of added echoes while minimizing further attenuation due to flow. The dead-time of the RF probe places a lower limit on the echo time; thus to avoid corruption of echoes due to probe ringing, these echoes were acquired with an echo time of 0.2 ms. Including CPMG enhancement, the pulse sequence can be described in two steps. First, a preparation step consisting of a 90° pulse followed by a delay of length $\tau_1$ before applying a 180° pulse and acquiring the first echo after a total time $TE=2\tau_1$. Immediately following the preparation step, a CPMG echo train is acquired with an echo time of 0.2 ms.

In testing DANTE pulses as a calibration method, the present inventors decreased the attenuation values to 17 and 23 dB to allow for shorter pulses. The composite 90° pulse consisted of three 1.5 us pulses, separated by a delay, $\delta$, of 36 us, corresponding to a nominal slice separation, $\Delta x$, of 0.257 mm. The dwell time was increased to 8 us to provide a narrower field of view of approx. 0.12 cm. Following a delay, $\tau$, of 0.2 ms, a "hard" 180° pulse refocused transverse magnetization, generating an echo at 0.4 ms. The built-in FFT algorithm was then used to obtain the 1D profile and intensities of the peaks were compared to estimate the offset between the excited slice and center of the Couette cell.

Sample Preparation

Measurements were performed on two different Newtonian fluids, doped water, and corn oil. Distilled water was doped with 30 mM of $CuSO_4$ to reduce the longitudinal relaxation time and improve sensitivity. Corn oil was used to investigate the limitations of diffusive attenuation and the effects of adding echoes. For shear-thinning fluids, xanthan gum (Bob's Red Mill Natural Foods Inc, OR) was mixed with distilled water in concentrations of 0.2 and 0.4 percent weight using a low-gear mixer (Mastercraft, TN) over a period of ten hours. Xanthan gum samples are a common choice of shear thinning fluid in NMR rheology measurements, and values of the flow behavior index can be found in the literature for a range of concentrations [45].

Results and Discussion

Verification of DANTE Calibration

Figure 7:
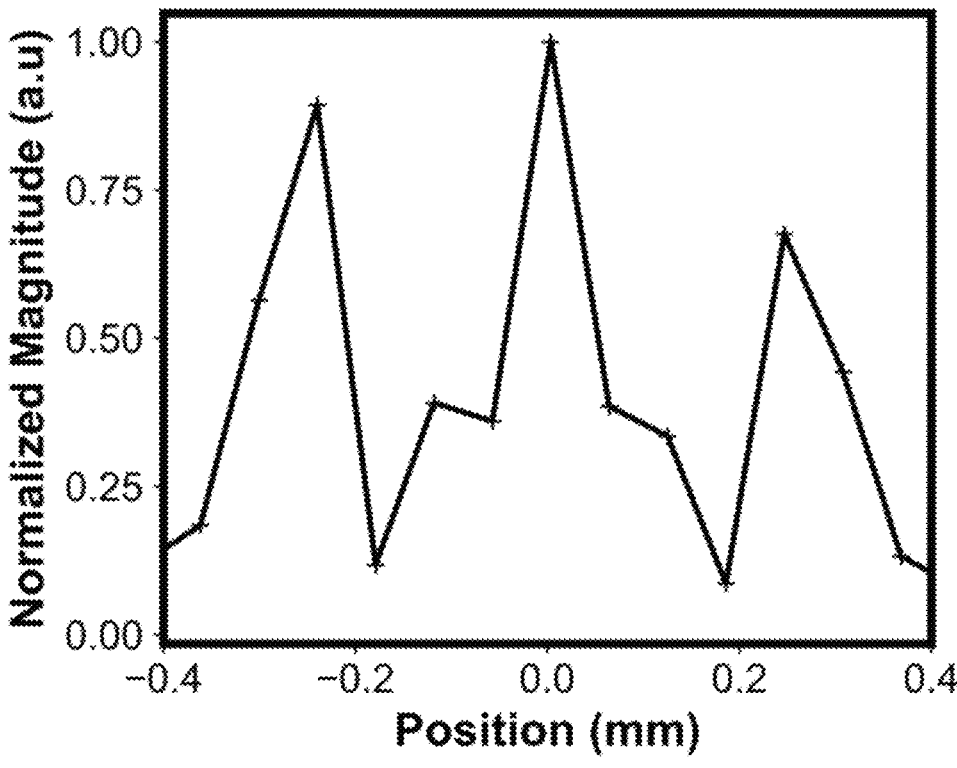
FIG. 7 is a 1D profile of a corn oil sample with three DANTE tags spaced by approx. 0.24 mm normalized to the intensity of the central peak.

The corn oil sample was used to test the DANTE calibration procedure, and the 1D profile containing three DANTE slices spaced by approx. 0.24 mm is shown in FIG. 7. The intensity of the left peak is approx. 1.32 times larger than that on the right. By comparing intensities and using the analysis described in Appendix A., the offset, $\Delta s$ is estimated to be approx. 2.69 mm. The agreement is remarkably close compared to a calculation using water as a reference sample (2.68 mm), confirming that DANTE pulses provide a faster and more direct calibration method.

Calibration is a very simple use of DANTE excitation; however, the same techniques could potentially be used to acquire spatially resolved flow behavior information. Although promising, this measurement is not without limitations. Acquiring more slices requires smaller separations, and hence, longer delays between pulses and larger acquisition windows. Therefore, due to the longer echo times required, this measurement is limited by diffusion even more so than others. It can be used on samples with slower diffusion, such as oil, but for water-based samples, a weaker gradient is needed.

Verification of CPMG Enhancement

Figure 8:
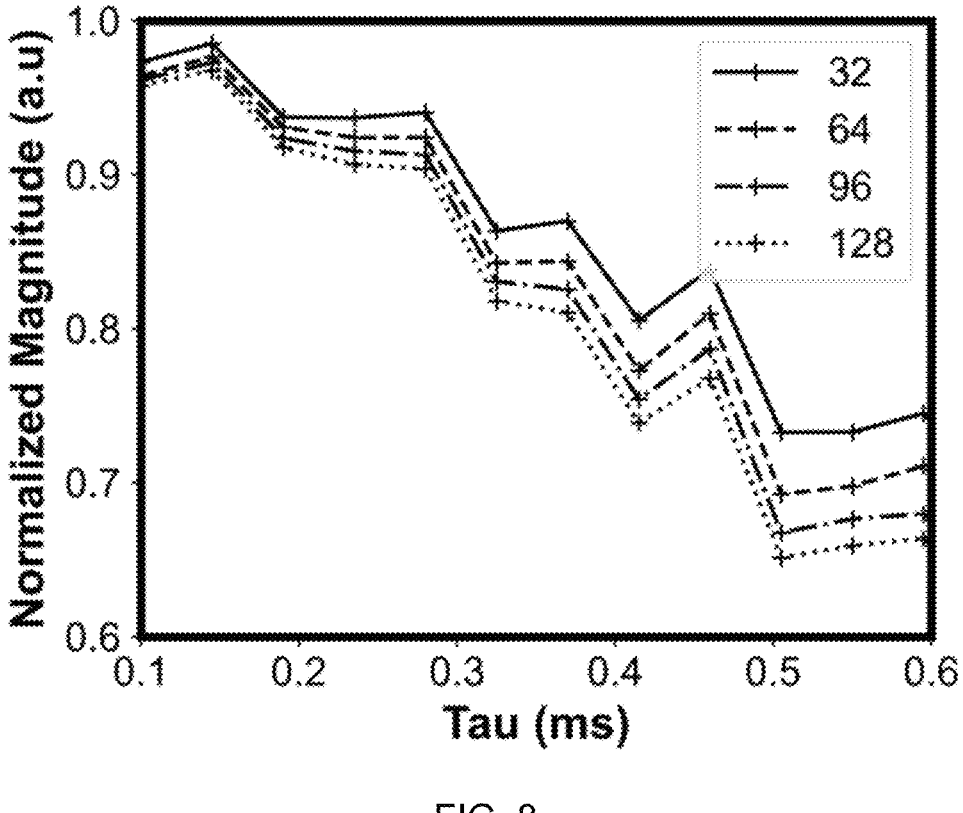
FIG. 8 is a graph of echo magnitude, first normalized to a stationary sample, then to that of the first echo for a rotating sample of corn oil after adding 32 (solid line), 64 (dashed line), 96 (dash-dot line), and 128 (dotted line) echoes.

To verify that flow effects can be neglected when using CPMG enhancement, the present inventors acquired a series of CPMG echo trains with varying echo times. Signal was acquired for a rotating sample of corn oil at a shear rate of 4.85 s$^{-1}$ and normalized to the stationary sample signal. FIG. 8 shows the twice normalized magnitude (first to a stationary sample, and then to the normalized first echo magnitude) for the rotating sample after adding 32, 64, 96, and 128 echoes. The present inventors observe that for values of $\tau2$ below 0.15 ms, up to 128 echoes can be added while maintaining >95% agreement with measurements of only the first echo. In addition to verifying the enhancement procedure, FIG. 8 demonstrates that for sufficiently short echo times, the CPMG echo train carries information on $T_2$ and diffusion that is unaffected by flow. This opens the possibility of combining measurement of rheological properties with conventional MR parameters.

Measurements of $T_2$ and Diffusion

Measurements of $T_1$, $T_2$, and the self-diffusion coefficient (D) for doped water and xanthan gum solutions are shown in Table 1. The present inventors observe that the differences between water and xanthan gum solutions are negligible, providing verification for the use of a Newtonian reference sample for calibration.

TABLE 1

Measurements of $T_2$, $T_1$, and the self diffusion coefficient (D) for samples of; distilled water doped, 0.2% wt. xanthan gum, and 0.4% wt. xanthan gum. All samples are doped with approx. 30 mM of $CuSO_4$.

| Sample | $T_2$ (ms) | $T_1$ (ms) | D ($\mu m^2$/ms) |
|---|---|---|---|
| Water | 7.9 ± 0.6 | 14.6 ± 0.5 | 2.15 ± 0.05 |
| 0.2% Xanthan Gum | 7.8 ± 0.6 | 17.1 ± 0.4 | 2.21 ± 0.05 |
| 0.4% Xanthan Gum | 7.7 ± 0.5 | 14.4 ± 0.3 | 2.01 ± 0.05 |

Taylor Instabilities

Figure 9:
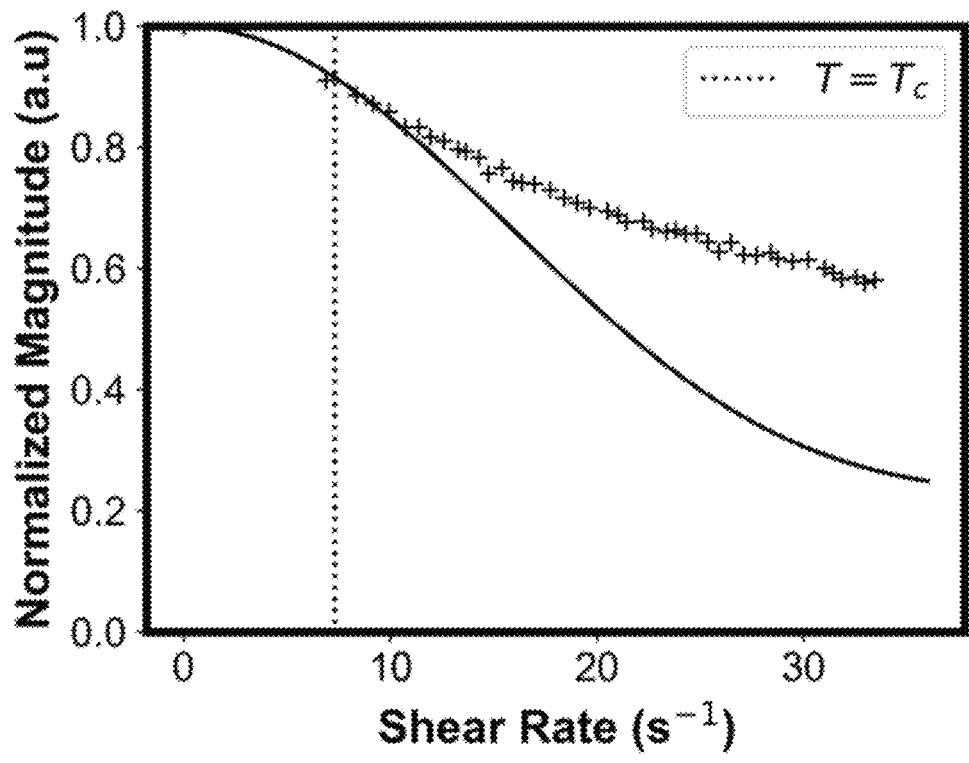
FIG. 9 is a graph of normalized echo magnitude at fixed $\tau$=0.25 ms plotted against shear rates ranging from 7 s−1 to 35 s−1. The solid line shows the theoretical prediction for circular Couette flow. The vertical dotted line indicates the shear rate of 7.2 s−1 where the critical Taylor number predicts the onset of instabilities.

FIG. 9 provides verification for assuming laminar flow, showing measurements of a doped water sample at a fixed r of 0.25 ms over shear rates ranging from approx. 7 s$^{-1}$ to 35 s$^{-1}$. The present inventors observe significant deviation from theoretical predictions at a shear rate of approx. 10 s$^{-1}$. Furthermore, the shear rate of 4.85 s$^{-1}$ used in all other measurements falls well below the shear rate of 7.2 s$^{-1}$ at which the onset of instabilities is predicted by the critical Taylor number (approx. 1700).

Measurements of the Flow Behavior Index

Figure 10:
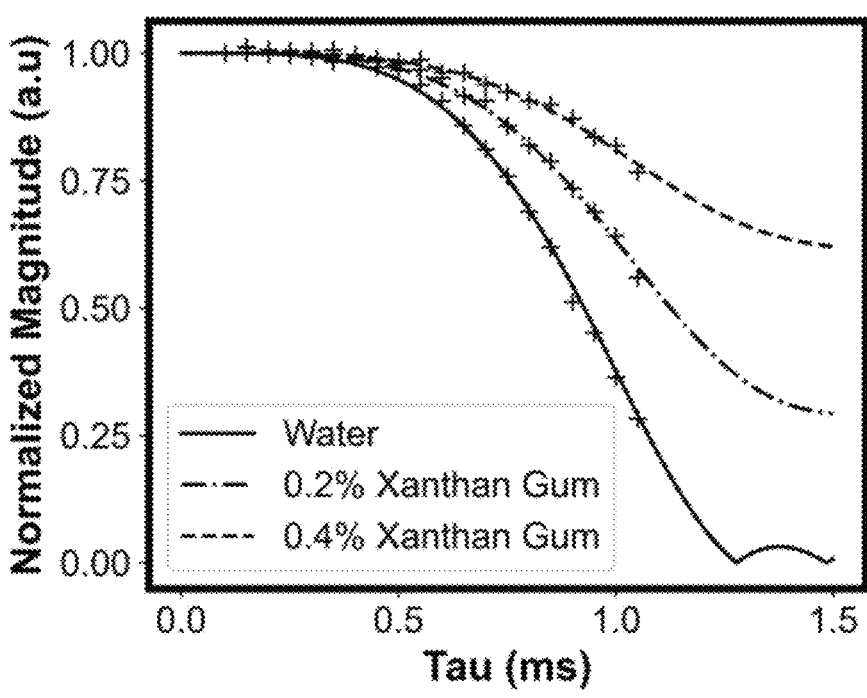
FIG. 10 is a graph of measurements of normalized magnitude (after adding echoes) vs. $\tau$ at a shear rate of 4.85 s$^{-1}$. Symbols represent measured data. Predicted behavior is shown for water (solid line), 0.2% wt. xanthan gum (dash-dot line), and 0.4% wt. xanthan gum (dashed line)

FIG. 10 show measurements of signal magnitude (after adding 16 echoes), normalized to the stationary sample signal for solutions of water, 0.2% wt. xanthan gum in water, and 0.4% wt. xanthan gum in water (all doped with 30 mM $CuSO_4$). The data of Equation 13, using the Newtonian reference calibration procedure to measure the angle, $\theta$, between the velocity and the magnetic field gradient. Fitted values of the flow behavior index are included in Table 2 and compared with literature values [45].

TABLE 2

Table of measured and expected values [45] of
the flow behavior index, n, for samples of 0.2% wt.
and 0.4% wt. xanthan gum in distilled water.

| Sample | Measured n | Expected n |
|---|---|---|
| 0.2% wt. Xanthan Gum | $0.40 \pm 0.02$ | $0.39 \pm 0.01$ |
| 0.4% wt. Xanthan Gum | $0.20 \pm 0.02$ | $0.23 \pm 0.01$ |

Measurements With Slower Diffusion

Figure 11:
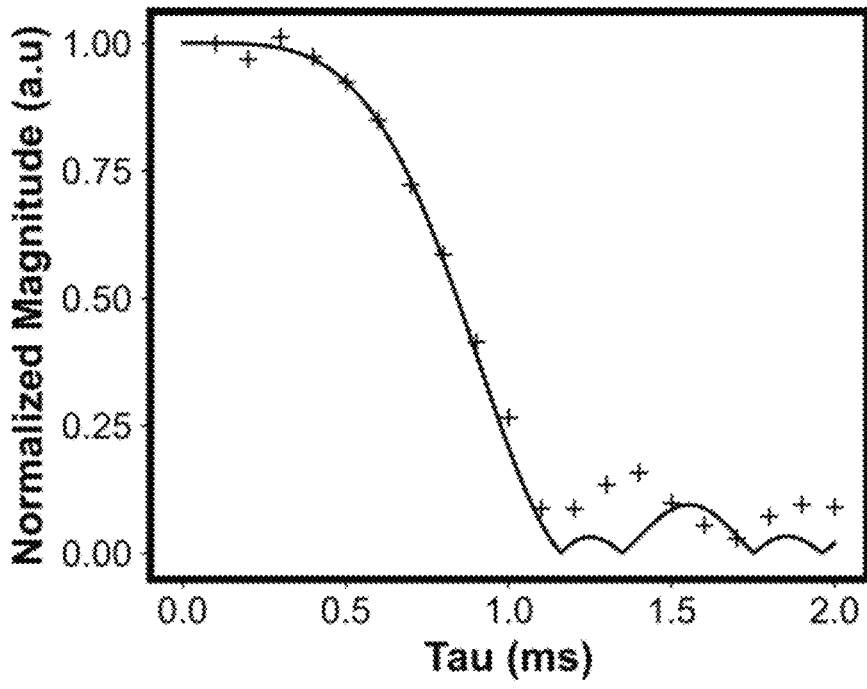
FIG. 11 is a graph of measurements of normalized magnitude plotted against $\tau$ for a sample of corn oil at a shear rate of 4.85 s$^{-1}$ fitted to numerical integration of Equation 13.
Figure 12:
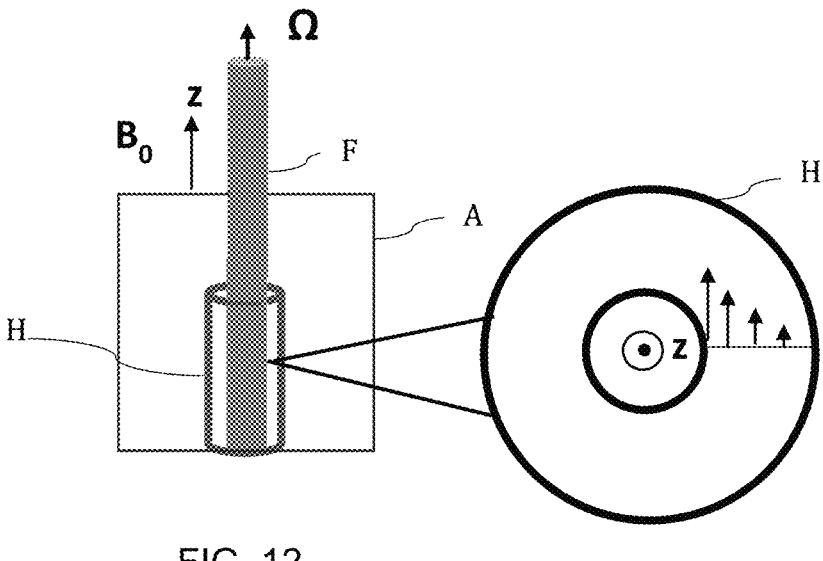
FIG. 12 is a schematic diagram of a Couette flow system with a cross-section of cylinder or tube (H).

FIG. 11 shows measurements of magnitude (after adding echoes and normalizing to a stationary sample) for a sample of corn oil at 21 different echo times ranging from 0.2 ms to 4.6 ms, equally spaced by 0.2 ms. This measurement is useful to investigate the behaviour at longer echo times. The data maintains a close agreement with the predicted behaviour up to $\tau = 1.0$ ms. After this point, the present inventors see oscillations in magnitude as predicted by theory; however, they do not occur with the predicted amplitude or frequency. It is possible that the decreased SNR makes these oscillations difficult to resolve, or that the thin slice approximation is less effective at these points.

Appendix A

Consider a DANTE excitation consisting of three pulses separated by a delay, $\delta$, resulting in generation of transverse magnetization within three slices separated by $$\Delta x = \frac{2\pi}{\gamma G \delta}.$$

Assuming a cylindrical volume of sample centred about the origin and defining the offset of the central slice from the origin as $\Delta s$, the ratio of intensities, $I_-$ and $I_+$, is equivalent to the ratio of the chord lengths, c− and c+, of the circular cross section at $\Delta s - \Delta x$ and $\Delta s + \Delta x$, respectively. Therefore, the offset, $\Delta s$, can be found be by solving the following equation, $$\frac{I_-}{I_+} = \frac{c_-}{c_+} = \frac{\sqrt{R_2^2 - (\Delta s - \Delta s)^2}}{\sqrt{R_2^2 - (\Delta s + \Delta x)^2}} \qquad (20)$$

Note that the above equation describes the case of a continuous cylindrical sample. In the presence of an inner cylinder, it becomes, $$\frac{I_-}{I_+} = \frac{c_-}{c_+} = \frac{\sqrt{R_2^2 - (\Delta s - \Delta x)^2} - \sqrt{R_1^2 - (\Delta s - \Delta x)^2}}{\sqrt{R_2^2 - (\Delta s + \Delta x)^2} - \sqrt{R_1^2 - (\Delta s + \Delta x)^2}} \qquad (21)$$

In both cases, it is easiest to solve for the offset, $\Delta s$, graphically. Knowing $\Delta s$, the angle between the velocity and the magnetic field gradient can be determined, $$\theta = \arcsin \frac{\Delta s}{R_1} \qquad (22)$$

While the teaching herein include illustrative embodiments and examples of some aspects of an invention, the description is not intended to be construed in a limiting sense. Thus, various modifications of the illustrative embodiments, as well as other embodiments of the invention, may be apparent to persons skilled in the art upon reference to this description. It is therefore contemplated that the appended claims will cover any such modifications or embodiments.

One or more methods described herein can be implemented by computer program instructions or code, which can be executed on a computer. For example, the code can be implemented by one or more digital processors (e.g., microprocessors or other processing circuitry), and can be stored on a computer program product including a non-transitory computer-readable medium (e.g., storage medium), e.g., a magnetic, optical, electromagnetic, or semiconductor storage medium, including semiconductor or solid state memory, magnetic tape, a removable computer diskette, a random access memory (RAM), a read-only memory (ROM), flash memory, a rigid magnetic disk, an optical disk, a solid-state memory drive, etc.

The program instructions can also be contained in, and provided as an electronic signal, for example in the form of software as a service (SaaS) delivered from a server (e.g., a distributed system and/or a cloud computing system). Alternatively, one or more methods can be implemented in hardware (logic gates, etc.), or in a combination of hardware and software. Example hardware can be programmable processors (e.g. Field-Programmable Gate Array (FPGA), Complex Programmable Logic Device), general purpose processors, graphics processing units (or GPUs) Application Specific Integrated Circuits (ASICs), and the like. One or more methods can be performed as part of or component of an application running on the system, or as an application or software running in conjunction with other applications and operating system.

One or more methods described herein can be run as a program in an NMR device or as a standalone program connected to an NMR device. Although the description has been described with respect to particular implementations thereof, these particular implementations are merely illustrative, and not restrictive. Concepts illustrated in the examples may be applied to other examples and implementations. Note that the functional blocks, operations, features, methods, devices, and systems described in the present disclosure may be integrated or divided into different combinations of systems, devices, and functional blocks as would be known to those skilled in the art. Any suitable programming language and programming techniques may be used to implement the routines and processing of particular implementations. Different programming techniques may be employed, e.g., procedural or object-oriented. The routines may execute on a single processing device or multiple processors. Although the steps, operations, or computations may be presented in a specific order, the order may be changed in different particular implementations. In some implementations, multiple steps or operations shown as sequential in this specification may be performed at the same time.

It will be appreciated that the various operations, processes, and methods disclosed herein can be embodied in a machine-readable medium and/or a machine accessible medium compatible with a data processing system (e.g., a computer system), and can be performed in any order (e.g., including using means for achieving the various operations). Accordingly, the specification and drawings are to be regarded in an illustrative rather than a restrictive sense. In some embodiments, the machine-readable medium can be a non-transitory form of machine-readable medium.

REFERENCES

[1] P. C. LAUTERBUR, Image formation by induced local interactions: Examples employing nuclear magnetic resonance, Nature 242 (5394) (1973) 190-191. doi:10.1038/242190a0.

[2] J. E. Tanner, Use of the stimulated echo in NMR diffusion studies, The Journal of Chemical Physics 52 (5) (1970) 2523-2526. doi:10.1063/1.1673336.

[3] T. Grover, J. R. Singer, NMR spin-echo flow measurements, Journal of Applied Physics 42 (3) (1971) 938-940. doi: 10.1063/1.1660189.

[4] R. Hayward, K. Packer, D. Tomlinson, Pulsed field-gradient spin echo n.m.r. studies of flow in fluids, Molecular Physics 23 (6) (1972) 1083-1102. doi:10.1080/00268977200101061.

[5] P. Coussot, Progress in rheology and hydrodynamics allowed by NMR or MRI techniques, Experiments in Fluids 61 (9) (September 2020). doi:10.1007/s00348-020-03037-y.

[6] P. T. Callaghan, Rheo-NMR: A new window on the rheology of complex fluids (March 2007). doi:10.1002/9780470034590.emrstm0470.

[7] P. T. Callaghan, Rheo NMR and shear banding, Rheologica Acta 47 (3) (2008) 243-255. doi:10.1007/s00397-007-0251-2.

[8] R. N. Al-kaby, S. L. Codd, J. D. Seymour, J. R. Brown, Characterization of velocity fluctuations and the transition from transient to steady state shear banding with and without pre-shear in a wormlike micelle solution under shear startup by rheo-nmr, Applied Rheology 30 (1) (2020) 1-13. doi:10.1515/arh-2020-0001.

[9] J. D. Seymour, B. Manz, P. T. Callaghan, Pulsed gradient spin echo nuclear magnetic resonance measurements of hydrodynamic instabilities with coherent structure: Taylor vortices, Physics of Fluids 11 (5) (1999) 1104-1113. doi:10.1063/1.869981.

[10] P. Galvosas, T. I. Brox, S. Kuczera, Rheo-NMR in food science—recent opportunities, Magnetic Resonance in Chemistry 57 (9) (2019) 757-765. doi:10.1002/mrc.4861.

[11] J. Go"tz, K. Zick, Rheo-NMR: Applications to food, Modern Magnetic Resonance (2008) 1819-1824doi: 10.1007/1-4020-3910-7 207.

[12] K.-F. Ratzsch, C. Friedrich, M. Wilhelm, Low-field rheo-NMR: A novel combination of NMR relaxometry with high end shear rheology, Journal of Rheology 61 (5) (2017) 905-917. doi:10.1122/1.4991513.

[13] S.-I. Han, O. Marseille, C. Gehlen, B. Blu"mich, Rheology of blood by NMR, Journal of Magnetic Resonance 152 (1) (2001) 87-94. doi:10.1006/jmre.2001.2387.

[14] G. Kaysan, N. Schork, S. Herberger, G. Guthausen, M. Kind, Contact mediated nucleation in melt emulsions investigated by rheo-nuclear magnetic resonance, Magnetic Resonance in Chemistry 60 (7) (2021) 615-627. doi:10.1002/mrc.5228.

[15] K. G. Hollingsworth, M. L. Johns, Rheo-nuclear magnetic resonance of emulsion systems, Journal of Rheology 48 (4) (2004) 787-803. doi:10.1122/1.1753277.

[16] V. Ra"ntzsch, M. Wilhelm, G. Guthausen, Hyphenated low-field NMR techniques: combining NMR with NIR, GPC/SEC and rheometry, Magnetic Resonance in Chemistry 54 (6) (2015) 494-501. doi:10.1002/mrc.4219.

[17] A. Colbourne, T. Blythe, R. Barua, S. Lovett, J. Mitchell, A. Sederman, L. Gladden, Validation of a low field rheo-NMR instrument and application to shear-induced migration of suspended non-colloidal particles in couette flow, Journal of Magnetic Resonance 286 (2018) 30-35. doi:10.1016/j.jmr.2017.11.010.

[18] B. Blu"mler, P. Blu"mler, G. Eidmann, A. Guthausen, R. Haken, U. Schmitz, K. Saito, G. Zimmer, The NMR-mouse: construction, excitation, and applications, Magnetic Resonance Imaging 16 (5-6) (1998) 479-484. doi: 10.1016/s0730-725x(98)00069-1.

[19] M. M. Ross, G. R. Wilbur, P. F. J. C. Barrita, B. J. Balcom, A portable, submersible, MR sensor—the proteus magnet, Journal of Magnetic Resonance 326 (2021) 106964. doi:10.1016/j.jmr.2021.106964.

[20] J. Guo, M. M. B. Ross, B. Newling, B. J. Balcom, Non-newtonian fluid velocity profiles determined with simple magnetic resonance spin echoes, Phys. Rev. Applied 16 (2021) L021001. doi:10.1103/Phys Rev Applied. 16.L021001.

[21] J. Guo, M. M. B. Ross, B. Newling, M. Lawrence, B. J. Balcom, Laminar flow characterization using low-field magnetic resonance techniques, Physics of Fluids 33 (10) (2021) 103609. doi:10.1063/5.0065986.

[22] E. M. Mudge, G. Mazzanti, Rheo-NMR measurements of cocoa butter crystallized under shear flow, Crystal Growth & Design 9 (7) (2009) 3111-3118. doi:10.1021/cg800999y.

[23] R. Tanner, Engineering Rheology, Oxford Engineering Science Series, OUP Oxford, 2000.

[24] R. P. Chhabra, J. F. Richardson, Non-Newtonian flow and applied rheology, 2nd Edition, Butterworth-Heinemann, Oxford, England, 2008.

[25] M. M. Cross, Rheology of non-newtonian fluids: A new flow equation for pseudoplastic systems, Journal of Colloid Science 20 (5) (1965) 417-437. doi:10.1016/0095-8522(65)90022-x.

[26] P. J. Carreau, Rheological equations from molecular network theories, Transactions of the Society of Rheology 16 (1) (1972) 99-127. doi:10.1122/1.549276.

[27] E. L. Koschmieder, Benard cells and Taylor vortices, Cambridge University Press, Cambridge England New York, 1993.

[28] M. Jastrzebski, H. A. Zaidani, S. Wronski, Stability of couette flow of liquids with power law viscosity, Rheologica Acta 31 (3) (1992) 264-273. doi:10.1007/bf00366505.

[29] M.-K. Yi, K. Chongyoup, Experimental studies on the taylor instability of dilute polymer solutions, Journal of Non-Newtonian Fluid Mechanics 72 (2-3) (1997) 113-139.

[30] J. Stepišnik, Analysis of NMR self-diffusion measurements by a density matrix calculation, Physica B+C 104 (3) (1981) 350-364. doi:10.1016/0378-4363(81)90182-0.

[31] D. O. Kuethe, R. J. Herfkens, Fluid shear and spin-echo images, Magnetic Resonance in Medicine 10 (1) (1989) 57-70. doi:10.1002/mrm.1910100106.

[32] I. Mastikhin, L. Hetherington, R. Emms, Oscillating gradient measurements of fast oscillatory and rotational motion in the fluids, Journal of magnetic resonance 214 (2012) 189-99. doi:10.1016/j.jmr.2011.11.003.

[33] A. N. Garroway, Velocity measurements in flowing fluids by MNR, Journal of Physics D: Applied Physics 7 (14) (1974) L159-L163. doi:10.1088/0022-3727/7/14/103.

[34] S. Meiboom, D. Gill, Modified spin-echo method for measuring nuclear relaxation times, Review of Scientific Instruments 29 (8) (1958) 688-691. doi:10.1063/1.1716296.

[35] H. Y. Carr, E. M. Purcell, Effects of diffusion on free precession in nuclear magnetic resonance experiments, Phys. Rev. 94 (1954) 630-638. doi:10.1103/Phys Rev. 94.630.

[36] C. Van den Broeck, Taylor dispersion revisited, Physica A: Statistical Mechanics and its Applications 168 (2) (1990) 677-696. doi:https://doi.org/10.1016/0378-4371 (90)90023-L.

[37] S. L. Codd, B. Manz, J. D. Seymour, P. T. Callaghan, Taylor dispersion and molecular displacements in poiseuille flow, Phys. Rev. E 60 (1999) R3491-R3494. doi:10.1103/Phys Rev E.60. R3491.

[38] A. Lutti, P. Callaghan, Measurement of diffusion in the presence of shear flow, Journal of Magnetic Resonance 180 (1) (2006) 83-92. doi:10.1016/j.jmr.2006.01.009.

[39] G. Bodenhausen, R. Freeman, G. A. Morris, A simple pulse sequence for selective excitation in fourier transform NMR, Journal of Magnetic Resonance (1969) 23 (1) (1976) 171-175. doi:10.1016/0022-2364(76)90150-5.

[40] M. Todica, B. Blümich, Optimization of the DANTE Pulse Sequence for Selective NMR Excitation in Strongly Inhomogeneous Magnetic Fields, International Journal of Modern Physics B 18 (10n11) (2004) 1571-1579. doi: 10.1142/s0217979204024896.

[41] J. C. Garc'ia-Naranjo, I. V. Mastikhin, B. G. Colpitts, B. J. Balcom, A unilateral magnet with an extended constant magnetic field gradient, Journal of Magnetic Resonance 207 (2) (2010) 337-344. doi:10.1016/j.jmr.2010.09.018.

[42] J. Mispelter, M. Lupu, A. Briguet, NMR Probeheads for Biophysical and Biomedical Experiments, IMPERIAL COLLEGE PRESS, 2015.

[43] S. Ahmadi, A. R. Aguilera, B. MacMillan, I. Mastikhin, Studies of periodic seawater spray icing with unilateral nmr, Journal of Magnetic Resonance 334 (2022) 107109. doi:https://doi.org/10.1016/j.jmr.2021.107109.

[44] T. Benson, P. Mcdonald, Profile amplitude modulation in stray-field magnetic-resonance imaging, Journal of Magnetic Resonance, Series A 112 (1) (1995) 17-23. doi:10.1006/jmra.1995.1004.

[45] T. Blythe, A. Sederman, J. Mitchell, E. Stitt, A. York, L. Gladden, Characterising the rheology of non-newtonian fluids using PFG-NMR and cumulant analysis, Journal of Magnetic Resonance 255 (2015) 122-131. doi:10.1016/j.jmr.2015.03.015.

We claim:

1. A method of characterizing flow behavior of a fluid sample comprising:

i) providing a magnet with a static magnetic field and a constant gradient where at least a portion of the sample defining a sensitive region is in the constant gradient;

ii) inducing circular Couette flow in the fluid in at least the sensitive region and providing a rotation speed of the sample;

iii) generating an NMR pulse sequence comprising at least two pulses with a delay between the pulses;

iv) acquiring at least one echo from the pulse sequence from the sensitive region v) measuring the magnitude of the NMR signal of the at least one acquired echo;

vi) normalizing the measured magnitude to a reference magnitude; and vii) determining a flow behavior index for the fluid sample though fitting the measured magnitudes using a numerical integration equation.

2. The method of claim 1, wherein the fluid is a non-Newtonian fluid.

3. The method of claim 2, wherein the magnet is a unilateral magnet.

4. The method of claim 3, wherein the echoes from the pulse sequence are acquired from a slice in the at least a portion of the sample.

5. The method of claim 2, wherein the fluid is located in the interstitial space between inner and outer concentric cylinders where the inner cylinder is located within the outer cylinder, the circular Couette flow is induced by rotating one of the cylinders while maintaining the other cylinder stationary, and the rotation speed is the rotation speed of the stationary cylinder.

6. The method of claim 1, wherein the integration equation is $$S = \int_{R_1}^{R_2} \rho(r) \int_{\theta_1}^{\theta_2} e^{-i\left(\gamma G v_\theta(r)\cos\theta \tau^2\right)} r\,dr\,d\theta$$

where S is the NMR signal, $R_1$ and $R_2$, are the radii of the inner and outer cylinders, $\gamma$ is the gyromagnetic ratio, G is the magnetic field gradient, v is a kinematic viscosity of the fluid sample, r is a radial position inside the sample, $\theta$ is the angle between the velocity and magnetic field gradient and d is the gap between the inner and outer cylinders, $\tau$ is a delay between pulses, and p(r) is spin density distribution.

7. The method of claim 1, wherein the pulse sequence is a Carr-Purcell-Meiboom-Gill sequence.

8. The method of claim 1, wherein the reference magnitude is acquired by carrying out steps i) and iii) to v), where the fluid sample is stationary.

9. The method of claim 8, wherein the NMR pulse sequence used in step iii) for the stationary sample is a DANTE sequence and wherein the echo time is varied.

10. The method of claim 1, wherein the reference magnitude is the magnitude of the NMR signal acquired from a Newtonian reference sample.

11. The method of claim 8, wherein the echo time for the NMR pulse sequence is shorter than the echo time used for the stationary sample.

12. The method of claim 1, further comprising in step iv), acquiring a first plurality of echoes where the echo times are varied, and in step v), measuring the magnitudes of the first plurality of echoes.

13. The method of claim 1, further comprising in step iv), acquiring a second plurality of echoes where the echo times of the second plurality of echoes are shorter than or equal to the echo times of the first plurality of echoes.

14. The method of claim 1, wherein the fluid sample is housed in the interstitial space between an inner and an outer cylinder, and wherein in step vii), the integration equation is $$S = \int_{R_1}^{R_2} e^{\left(-i\gamma G \upsilon_\theta(r)\cos\theta\tau^2\right)} r dr + \int_{R_1}^{R_2} e^{\left(i\gamma G \upsilon_\theta(r)\cos\theta\tau^2\right)} r dr = \qquad (13)$$

$$\int_{R_1}^{R_2} \cos\left(\gamma G \upsilon_\theta(r)\cos\theta\tau^2\right) r dr$$

where S is the NMR signal, $R_1$ and $R_2$, are the radii of the inner and outer cylinders, $\gamma$ is the gyromagnetic ratio, G is the magnetic field gradient, v is a kinematic viscosity of the fluid sample, r is a radial position inside the sample, $\theta$ is the angle between the velocity and magnetic field gradient, d is the gap between the inner and outer cylinders, and $\tau$ is a delay between pulses.

15. The method of claim 1, wherein step vii) the integration equation is $$S = 2\pi \int_{R_1}^{R_2} J_0\left(\gamma G \upsilon_\theta(r)\tau^2\right) r dr$$

where S is the NMR signal, $R_1$ and $R_2$, are the radii of the inner and outer cylinders, $\gamma$ is the gyromagetic ratio, G is the magnetic field gradient, v is a kinematic viscosity of the fluid sample, $J_0$ is a Bessel function of the first kind, and $\tau$ is a delay time.

16. The method of claim 1, further comprising using the normalized magnitude to derive a shear rate for the fluid sample.

17. An NMR system comprising:

a portable unilateral magnetic having a constant gradient perpendicular to a surface of the magnet;

a tubular stator vessel suitable for holding a sample fluid, wherein the stator is adjacent the surface and at least partially located in the constant gradient;

a tubular rotor located inside of the stator vessel along the central longitudinal axis of the stator vessel;

a motor operably connected to the tubular rotor for rotating the rotor around the central axis;

a radio frequency coil around the tubular stator; and an NMR console operably connected to the radio frequency coil.

18. The NMR system of claim 17, further comprising a sensor for measuring the rotation speed of the tubular rotor.

19. The NMR system of claim 17, wherein the NMR console comprises a radio frequency generator and a radio frequency detector both operably connected to the radio frequency coil, and a computer system operably connected to the radio frequency detector.

20. The NMR system of claim 19, wherein the computer system comprising computer program instructions for computer implemented steps comprising generating an NMR pulse sequence comprising at least two pulses with a delay between the pulses;

acquiring at least one echo from the pulse sequence from the sensitive region;

measuring the magnitude of the NMR signal of the at least one acquired echo;

normalizing the measured magnitude to a reference magnitude; and determining a flow behavior index for the fluid sample though fitting the measured magnitudes using a numerical integration equation.

* * * * *